United States Patent [19]
Randolph et al.

[11] Patent Number: 5,949,718
[45] Date of Patent: Sep. 7, 1999

[54] METHOD AND SYSTEM FOR SELECTED SOURCE DURING READ AND PROGRAMMING OF FLASH MEMORY

[75] Inventors: Mark Randolph, San Jose; Collin Bill, Cupertino; Michael Van Buskirk, Saratoga, all of Calif.

[73] Assignee: Advanced Micro Devices, Inc., Sunnyvale, Calif.

[21] Appl. No.: 08/992,622

[22] Filed: Dec. 17, 1997

[51] Int. Cl.$^6$ .................................................. G11C 16/00
[52] U.S. Cl. ................... 365/185.33; 365/185.05
[58] Field of Search ........................ 365/185.33, 185.05, 365/185.18

[56] References Cited

U.S. PATENT DOCUMENTS

| | | | |
|---|---|---|---|
| 5,311,466 | 5/1994 | Natale et al. | 365/185.33 |
| 5,661,682 | 8/1997 | Lim et al. | 365/185.05 |
| 5,748,527 | 5/1998 | Lee et al. | 365/185.33 |

Primary Examiner—Tan T. Nguyen
Attorney, Agent, or Firm—Sawyer & Associates

[57] ABSTRACT

A system and method for providing a flash memory is disclosed. The flash memory includes a plurality of memory cells. Each memory cell includes a source and a gate. The method and system include providing a plurality of word lines and a plurality of select devices. Each word line is coupled with the gate of each memory cell of a portion of the plurality of memory cells. Each word line provides a specific voltage to the portion of the plurality of memory cells during a read of a memory cell of the portion of the plurality of memory cells. The plurality of select devices correspond with the plurality of word lines. Each select device is coupled with the source of each memory cell of the portion of the plurality of memory cells coupled with the corresponding word line. Each select device couples the source of each memory cell of the portion of the plurality of memory cell with a specific potential during the read of the memory cell. The method and system reduce the number of memory cells coupled in parallel with the memory cell during the read.

21 Claims, 2 Drawing Sheets

METHOD AND SYSTEM FOR SELECTED SOURCE DURING READ AND PROGRAMMING OF FLASH MEMORY

FIELD OF THE INVENTION

The present invention relates to flash memory and more particularly to a method and system for limiting the number of memory cells coupled in parallel during a read.

BACKGROUND OF THE INVENTION

A conventional flash memory is divided into sectors. Each sector includes a large number of memory cells, which are conventionally floating gate devices such as floating gate transistors. Each sector of the conventional flash memory typically includes enough memory cells for one half of a megabyte of storage. Each memory cell includes a gate, a source and a drain. The gate of each memory cell is coupled to a word line. The drain of each memory cell is coupled to a bit line. Typically the drains of five hundred and twelve memory cells are coupled to the same bit line. Each word line and bit line couples only a portion of the memory cells in the sector. Thus, applying a voltage to a word line or a bit line provides the voltage to the gates or drains, respectively, of only the memory cells coupled to the word line or bit line, respectively. Although the gates and drains are coupled to word lines and bit lines, respectively, the sources of all of memory cells in the sector are typically coupled together. Coupling the sources of all of the memory cells in the sector reduces the space required to hold the sector. This reduction of required space is beneficial in flash memory because more memory cells may be placed in a given area. When a voltage is applied to the source of one memory in the sector, the voltage is applied to the sources of all of the memory cells in the sector.

A read operation is performed on conventional flash memories by sensing current. To read a state of a particular memory cell, voltages are applied to the gate, source, and drain of the memory cell. A voltage is applied to the word line coupled to the gate of the memory cell. The source of the memory cell is tied to ground by grounding a line coupled to all of the sources of the memory cells in the sector. A voltage is also applied to the bit line coupled to the drain of the memory cell. The current flowing through the memory cell is then read. The magnitude of the current indicates the state of the memory cell, for example whether the state of the memory cell corresponds to a one or a zero.

Conventional erasing of a memory cell is achieved by applying a relatively high negative voltage to the gate and applying a relatively high positive voltage to the source. Application of these voltages moves charges from the floating gate to the source. Because the sources are tied together, a large positive voltage is applied to all of the sources in the sector. After these voltages are applied, the memory cell is read to ensure that the erasure is complete. If erasure is not complete, then the error introduced by the incomplete erasure will be corrected.

Conventional memory cells may have a leakage current between the source and the drain. This leakage current may flow through the source when no voltage is applied to the gate of the memory cell and could affect reading of another memory cell. When grounding the source of the memory cell being read, the sources of all of the memory cells in the sector are grounded. A voltage is also applied to the drains all memory cells coupled to the same bit line as the memory cell being read. As a result, five hundred and eleven memory cells which are not selected for reading but share the same bit line as the memory cell selected for reading are coupled to ground in parallel with the selected memory cell. The leakage current from the non-selected memory cells may, therefore, combine with the read current due to the memory cell to be read. This phenomenon may result in false readings of the memory cell being read. In addition, when a memory cell is checked during an erase, the leakage currents from five hundred and eleven non-selected memory cells sharing the same bit line as the memory cell being checked may cause false readings which incorrectly indicate that the memory cell has not been erased. This apparent error in erasure of the memory cell will be corrected, increasing the time required to properly erase the memory cell.

Accordingly, what is needed is a system and method for reducing the leakage current due to non-selected memory cells, allowing more accurate read and larger sector sizes. The present invention addresses such a need.

SUMMARY OF THE INVENTION

The present invention provides a method and system for providing a flash memory. The flash memory includes a plurality of memory cells. Each memory cell includes a source and a gate. The method and system comprise providing a plurality of word lines and a plurality of select devices. Each word line of the plurality of word lines is coupled with the gate of each memory cell of a portion of the plurality of memory cells. Each word line provides a specific voltage to the portion of the plurality of memory cells during a read of a memory cell of the portion of the plurality of memory cells. The plurality of select devices correspond with the plurality of word lines. Each select device of the plurality of select devices is coupled with the source of each memory cell of the portion of the plurality of memory cells coupled with the corresponding word line. Each select device couples the source of each memory cell of the portion of the plurality of memory cell with a specific potential during the read of the memory cell.

According to the system and method disclosed herein, the present invention limits the number of non-selected memory cells coupled in parallel with a memory cell being read, thereby allowing for more accurate reads and erases and larger sector sizes.

DETAILED DESCRIPTION OF THE INVENTION

The present invention relates to flash memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
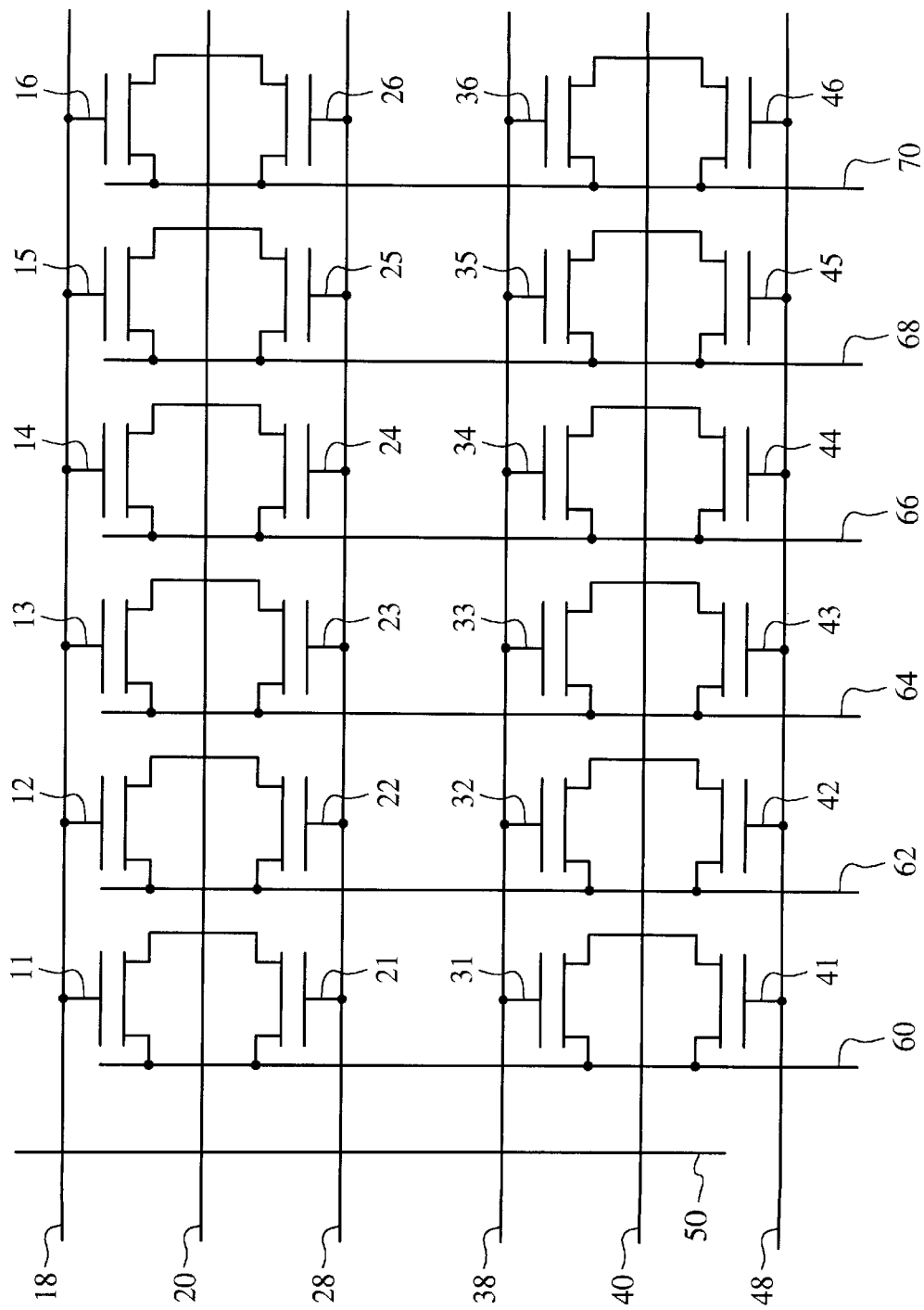
FIG. 1 is a block diagram of a portion of a conventional flash memory.

FIG. 1 is a block diagram depicting a portion of a sector in a conventional flash memory 10. The flash memory 10 includes memory cells 11–16, 21–26, 31–36, and 41–46.

Typically, the memory cells 11–16, 21–26, 31–36, and 41–46 are floating gate devices such as floating gate transistors. Each memory cell 11–16, 21–26, 31–36, and 41–46 includes a gate, a source and a drain. The gates of the memory cells 11–16, 21–26, 31–36, and 41–46 are coupled to word lines 18, 28, 38, and 48, respectively. The sources of the memory cells 11–16 and 21–26 are coupled to line 50 through a source line 20. Similarly, the sources of memory cells 31–36 and 41–46 are coupled to the line 50 through a source line 40. Thus, the sources of all of the memory cells 11–16, 21–26, 31–36, and 41–46 in the sector of the flash memory 10 are coupled in common. The reason the sources of memory cells 11–16, 21–26, 31–36, and 41–46 are coupled together is to save space, allowing more memory cells 11–16, 21–26, 31–36, and 41–46 to be placed in a given area on a semiconductor.

The drain of each memory cell 11–16, 21–26, 31–36, and 41–46 is coupled to a bit line. The drains of memory cells 11, 21, 31, and 41 are coupled to bit line 60. The drains of memory cells 12, 22, 32, and 42 are coupled to bit line 62. The drains of memory cells 13, 23, 33, and 43 are coupled to bit line 64. The drains of memory cells 14, 24, 34, and 44 are coupled to bit line 66. The drains of memory cells 15, 25, 35, and 45 are coupled to bit line 68. The drains of memory cells 16, 26, 36, and 46 are coupled to bit line 70. Although only four cells are depicted as being coupled to a single bit line 64, 66, 68, or 70, typically five hundred and twelve memory cells are coupled to the same bit line. The word line and bit line allow the memory cells 11–16, 21–26, 31–36, and 41–46 to be addressed.

A read operation is performed on a cell in the flash memory 10 by sensing current flowing through the memory cell. For example, to read a state of the memory cell 12, voltages are applied to the word line 18 and to the bit line 62. The source of the memory cell 12 is tied to ground by coupling the line 50 to ground. Coupling the line 50 to ground couples the source line 20 and, therefore, the source of the memory cell 12, to ground. The current flowing through the memory cell 12 is then read. The magnitude of the current indicates the state of the memory cell 12.

Conventional erasing of a memory cell is achieved by applying a relatively high negative voltage to the gate and applying a relatively high positive voltage on the source. For example, to erase memory cells 11–16, a high negative voltage is applied to the gates of the memory cell 11–16 by providing a high negative voltage on the word line 18. A high positive voltage would be applied to the sources of the memory cell 11–16 by providing a high positive voltage on the line 50. As a result, charge flows from the gates to the sources of the memory cells 11–16. In addition, a large positive voltage is applied to all of the sources of the memory cells 11–16, 21–26, 31–36, and 41–46 in the sector. After these voltages are applied, the memory cells 11–16 are read to ensure that the erasure is complete.

Although the memory cells 11–16, 21–26, 31–36, and 41–46 in the flash memory 10 can be read, programmed, and erased, one of ordinary skill in the art will readily recognize that each of the conventional memory cells 11–16, 21–26, 31–36, and 41–46 may have a leakage current between the source and the drain. This leakage current may flow through the source when no voltage is applied to the gate of the memory cells. The leakage current from a non-selected memory cell may adversely affect a read operation of a memory cell selected for reading.

As discussed above, the sources of all of the memory cells in the sector are tied to the line 50. When the source of the memory cell 12 to be read is grounded, the sources of all the memory cells in the sector, for example memory cells 11, 13–16, 21–26, 31–36, and 41–46, are also tied to ground. Moreover, the drains of the memory cells 12, 22, 32, and 42 are coupled to a voltage. Thus, the memory cells 12, 22, 32, and 42 are coupled to ground in parallel. The leakage current from the non-selected memory cells 22, 32, and 42 may, therefore, combine with the read current from the memory cell 12, resulting in a false reading for the memory cell 12. In addition, when a memory cell 12 is checked after an erase, the leakage currents from other memory cells 22, 32, and 42 may cause false reading. The false reading which increase the time required to properly erase the memory cell.

Although only non-selected memory cells 22, 32, and 42 are depicted in FIG. 1, typically there are five hundred and twelve memory cells coupled to the same bit line. Thus, there are five hundred and eleven non-selected memory cells coupled in parallel with the selected memory cell during a read or erase operation. As a result, the affects of leakage current, including false readings, are exacerbated.

The present invention provides for a method and system for selecting a flash memory cell for reading while reducing the number of non-selected memory cells coupled in parallel with the selected memory cell. The method and system provide a select device coupled to each source line in a flash memory. The select devices allow the sources of only those memory cells coupled to the select device to be coupled together. The select device is turned on while a read voltage is coupled to the word line coupled to the memory cell to be read. As a result, the number of non-selected memory cells coupled in parallel with a selected memory cell are reduced.

The present invention will be described in terms of a portion of a sector of a flash memory including memory cells having a particular structure. In addition, the present invention will be described in terms of a particular number of devices coupled to a word line and bit line. However, one of ordinary skill in the art will readily recognize that this method and system will operate effectively for other types of memory cells and sectors of other sizes.

Figure 2:
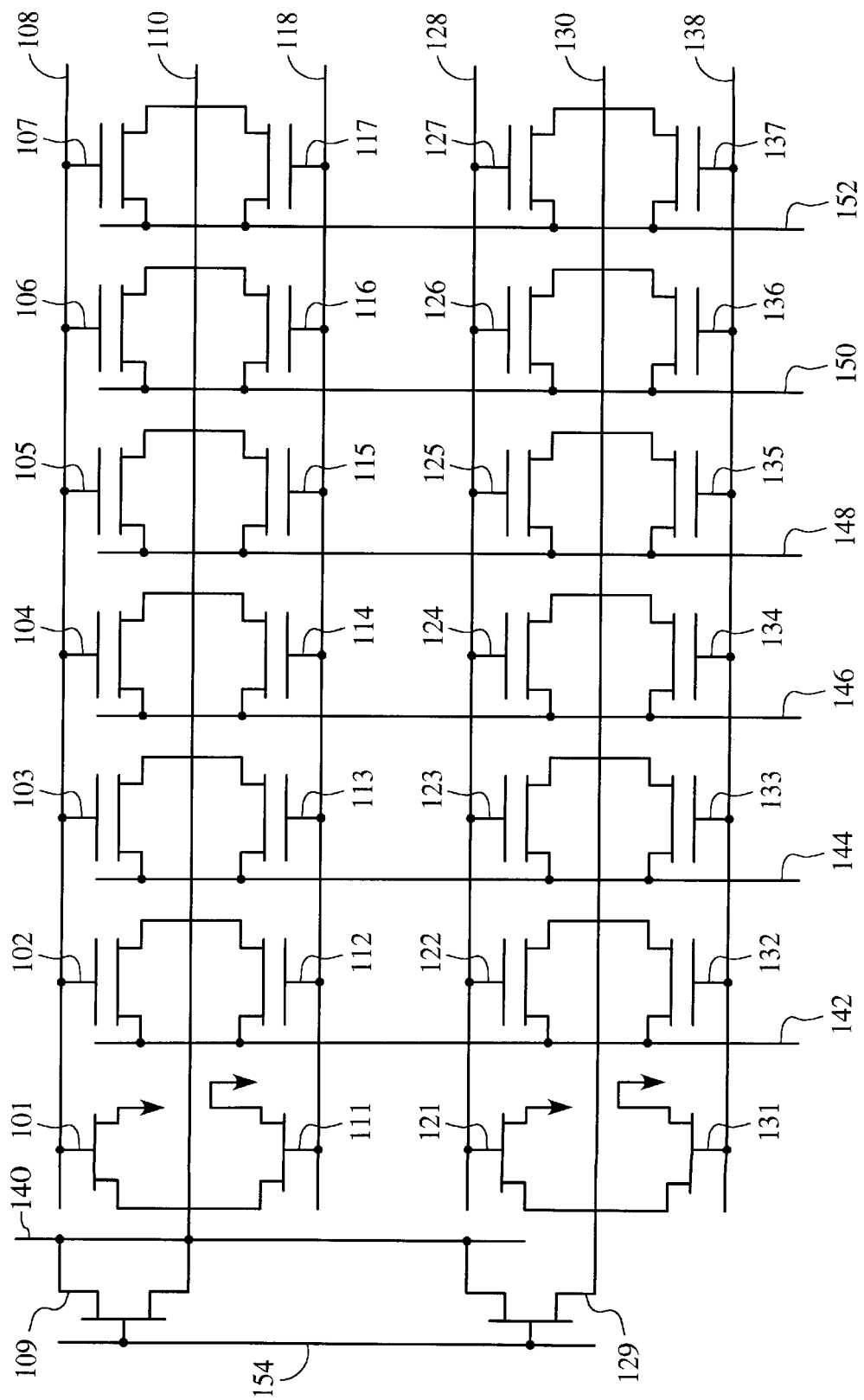
FIG. 2 is a block diagram of a portion of a flash memory in accordance with present invention.

To more particularly illustrate the method and system in accordance with the present invention, refer now to FIG. 2 depicting a block diagram of one embodiment of a portion of a sector in flash memory 100 in accordance with the present invention. The flash memory 100 includes memory cells 102–107, 112–117, 122–127, and 132–137. In a preferred embodiment, the memory cells 102–107, 112–117, 122–127, and 132–137 are floating gate devices such as floating gate transistors. In the flash memory 100, the gates of memory cells 102–107 are coupled to the word line 108. In the flash memory 100, the gates of memory cells 112–117 are coupled to the word line 118. In the flash memory 100, the gates of memory cells 122–127 are coupled to the word line 128. In the flash memory 100, the gates of memory cells 132–137 are coupled to the word line 138. The sources of memory cells 102–107 and 112–117 are coupled to a source line 110. Similarly, the sources of memory cells 122–127 and 132–137 are coupled to a source line 130.

The flash memory 100 also includes select devices 101, 111, 121, and 131. In one embodiment, the select devices 101, 111, 121, and 131 are transistors. In a preferred embodiment, the select devices 101, 111, 121, and 131 are MOS transistors. The select devices 101, 111, 121, and 131 each have a source coupled to ground. The select devices 101 and 111 and the select devices 121 and 131 each also have a drain coupled to source lines 110 and 130, respectively. The select devices 101, 111, 121, and 131 allow a single memory cell of the memory cells 102–107, 112–117, 122–127, and 132–137, respectively, to be read without coupling all of the memory cells 102–107, 112–117, 122–127, and 132–137 in parallel during the read operation.

For example, suppose memory cell 103 is to be read. The current drawn through the memory cell 103 is sensed to read the state of the memory cell 103. In order to perform the read operation, voltages are applied to the gate and drain of the memory cell 103 through the word line 108 and the bit line 144, respectively. Because the voltage applied to the gate of the memory cell 103 is provided through the word line 108, this voltage is also applied to the gate of the select device 101. The select device 101 is, therefore, turned on. As a result, the source line 110 is grounded through the select device 101. The current passing through the memory cell 103 can then be read to determine the state of the memory cell 103.

Because only the select device 101 is turned on by the application of a voltage on the word line 108, the sources of most non-selected memory cells, such as memory cells 122–127 and 132–137 are not coupled to ground. As a result, these non-selected memory cells are not coupled in parallel with the memory cell 103 to be read. Any leakage current from these non-selected memory cells 122–127 and 132–137 will not greatly affect reading of the memory cell 103. Thus, despite the fact that memory cells 123 and 133 are coupled to the same bit line 144 as the memory cell 103, leakage current from the memory cells 123 and 133 should not affect the read of the memory cell 103.

In order to perform an erase, erase elements 109 and 129 are used. In one embodiment, erase elements 109 and 129 are transistors. For example, to erase the memory cells 102–107, a high negative voltage may be applied to the word line 108. In order to perform an erase, a voltage is applied to line 154 to turn on the erase element 109. A high positive voltage is applied to the line 140. Because the erase element 109 is on, the sources of the memory cells 102–107 are coupled to the high voltage. Thus, an erase is performed.

Reading becomes more accurate because the leakage currents are reduced. In addition, less time may be spent on the erase because less time is required to correctly diagnose erase errors. In addition, the select devices 101, 111, 121, and 131 are controlled using a voltage already provided on the flash memory: the voltage applied to the corresponding word lines 108, 118, 128, and 138. Thus, a separate voltage source to control the select devices 101, 111, 121, and 131 need not be provided, saving space in the flash memory 100.

Because leakage currents are reduced, the present invention also provides the ability to have larger sector sizes. Currently, one limitation in the sector size is the inability to accurately read the state of a particular memory cell because of the presence of leakage currents. A flash memory 100 in accordance with the present invention has reduced leakage current. Limitations on the sector size because of leakage current are, therefore, reduced or removed. As the sectors are made larger, space is used more efficiently by the flash memory 100, allowing more memory cells to be provided in the flash memory 100. Thus, in addition to allowing a more reliable read operation, the present invention allows for bigger sectors and more dense packing of memory cells in the flash memory 100.

Moreover, some layouts currently provide dummy transistors along word lines for other purposes. These dummy transistors could be used as the source select devices 101, 111, 121, and 131. This would allow for more accurate read voltages without increasing the number of cells in a sector.

When the sector size is made larger, as discussed above, an even greater space saving is achieved, allowing the memory cells 101–107, 111–117, 121–127, and 131–137 to be more densely packed.

A flash memory in accordance with the present invention also allows for erasure of a single memory cell 102–108, 112–118, 122–128, or 132–138. Erasure of a single memory cell 102–107, 112–117, 122–127, or 132–137 can be accomplished by applying an erase voltage to the drain rather than to the source. Thus, a large negative voltage is applied to the word line 108, 118, 128, or 138 while a large positive voltage is applied to the bit line 142, 144, 146, 148, 150, or 152. Consequently, a single memory cell coupled to both the word line and the bit line to which the voltages are applied can be selectively erased.

A method and system has been disclosed for reducing the number of memory cells coupled in parallel with a memory cell selected for reading. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for providing a flash memory including a plurality of memory cells, each memory cell including a source and a gate, the system comprising:

a plurality of word lines, each word line of the plurality of word lines coupled with the gate of each memory cell of a portion of the plurality of memory cells, each word line for providing a specific voltage to the portion of the plurality of memory cells during a read of a memory cell of the portion of the plurality of memory cells; and a plurality of select devices corresponding to the plurality of word lines, each select device of the plurality of select devices coupled with the source of each memory cell of the portion of the plurality of memory cells coupled with the corresponding word line, each select device of the plurality of select devices coupling the source of each memory cell of the portion of the plurality of memory cells with a specific potential during the read of the memory cell of the portion of the plurality of memory cells.

2. The system of claim 1 wherein each select device of the plurality of select devices is further coupled with the corresponding word line, each of the plurality of select devices being turned on by application of the specific voltage on the corresponding word line.

3. The system of claim 2 wherein the specific potential is ground.

4. The system of claim 3 wherein each select device of the plurality of select devices further includes a gate coupled to the corresponding word line.

5. The system of claim 4 further comprising a plurality of erase elements coupled with the sources of the portion of the plurality of memory cells, the plurality of erase elements providing an erase voltage to the sources of the portion of the plurality of memory cells.

6. The system of claim 5 wherein the plurality of select devices further comprise a plurality of transistors.

7. The system of claim 6 wherein the plurality of memory cells further comprise a plurality of floating gate transistors.

8. The system of claim 7 wherein each of the plurality of memory cells further includes a drain, the system further comprising:

a plurality of bit lines, each of the plurality of bit lines being coupled with the drains of a second portion of the plurality of memory cells.

9. The system of claim 8 wherein the plurality of bit lines further allow erasure of a single memory.

10. A method for providing a flash memory including a plurality of memory cells, each memory cell including a source and a gate, the method comprising the steps of:

providing a plurality of word lines, each word line of the plurality of word lines coupled with the gate of each memory cell of a portion of the plurality of memory cells, each word line for providing a specific voltage to the portion of the plurality of memory cells during a read of a memory cell of the portion of the plurality of memory cells; and providing a plurality of select devices corresponding with the plurality of word lines, each select device of the plurality of select devices coupled with the source of each memory cell of the portion of the plurality of memory cells coupled with the corresponding word line, each select device of the plurality of select devices coupling the source of each memory cell of the portion of the plurality of memory cell with a specific potential during the read of the memory cell of the plurality of memory cells.

11. The method of claim 10 wherein each select device is further coupled with the corresponding word line, the select device being turned on by application of the specific voltage.

12. The method of claim 11 wherein the specific potential is ground.

13. The method of claim 12 wherein each select device further includes a gate coupled to the corresponding word line.

14. The method of claim 13 further comprising the step of:

providing a plurality of erase elements coupled with the sources of the portion of the plurality of memory cells, the plurality of erase elements providing an erase voltage to the sources of the portion of the plurality of memory cells.

15. The method of claim 14 wherein the plurality of select devices further comprise a plurality of transistors.

16. The method of claim 15 wherein the plurality of memory cells further comprise a plurality of floating gate transistors.

17. The method of claim 16 wherein each of the plurality of memory cells further includes a drain, the method further comprising the step of:

providing a plurality of bit lines, each of the plurality of bit lines being coupled with the drains of a second portion of the plurality of memory cells.

18. The method of claim 17 wherein the plurality of bit lines further allow erasure of a single memory.

19. A method for reading a flash memory including a plurality of memory cells, a plurality of word lines, and a plurality of select devices corresponding to the plurality of word lines, each memory cell including a source and a gate, each word line of the plurality of word lines coupled with the gates of a portion of the plurality of memory cells, each of the select devices being coupled with the sources of the portion of the plurality of memory cells coupled with the corresponding word line, the method comprising the steps of:

providing a specific voltage on a word line of the plurality of word lines for reading a memory cell of the portion of the plurality of memory cells coupled with the word line; and providing a potential to the sources of the portion of the plurality of memory cells memory cells coupled with the corresponding word line by turning on the select device of the plurality of devices corresponding to the word line.

20. The method of claim 19 wherein the each of the plurality of select devices further includes a gate coupled with the corresponding word line of the plurality of word lines, the step of providing the potential to the sources further comprising the step of:

providing the specific voltage on the word line corresponding to the select device, wherein the select device is turned on by the specific voltage.

21. The method of claim 20 wherein the potential is ground.

* * * * *